US008105935B2

(12) United States Patent
Ohara et al.

(10) Patent No.: US 8,105,935 B2
(45) Date of Patent: Jan. 31, 2012

(54) METHOD OF MANUFACTURING A SEMICONDUCTOR DEVICE

(75) Inventors: Naoki Ohara, Kawasaki (JP); Hirofumi Watatani, Kawasaki (JP); Tamotsu Owada, Kawasaki (JP); Kenichi Yanai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/051,193

(22) Filed: Mar. 19, 2008

(65) Prior Publication Data
US 2008/0233734 A1 Sep. 25, 2008

(30) Foreign Application Priority Data

Mar. 19, 2007 (JP) ................................. 2007-071425

(51) Int. Cl.
*H01L 21/4763* (2006.01)
(52) U.S. Cl. ........ 438/618; 438/625; 438/627; 438/687; 438/644; 257/753; 257/E21.584; 257/E23.141; 257/E21.579
(58) Field of Classification Search .................. 438/618, 438/714, 715, 730, 425, 224, 625, 627, 687, 438/644; 257/40, 72, E21.495, 753, E21.584, 257/E23.141, E21.579
See application file for complete search history.

(56) References Cited

U.S. PATENT DOCUMENTS

| 5,447,887 | A | * | 9/1995 | Filipiak et al. ................. 438/644 |
| 6,727,515 | B2 | * | 4/2004 | Nakata et al. .................... 257/40 |
| 6,956,236 | B1 | * | 10/2005 | Sasaki et al. .................... 257/72 |
| RE40,264 | E | * | 4/2008 | Flamm ............................ 216/59 |
| 7,396,759 | B1 | * | 7/2008 | van Schravendijk et al. .. 438/625 |
| 7,915,166 | B1 | * | 3/2011 | Yu et al. ......................... 438/687 |
| 2006/0281299 | A1 | * | 12/2006 | Chen et al. .................... 438/622 |
| 2007/0139451 | A1 | * | 6/2007 | Somasiri et al. .............. 346/138 |
| 2008/0132055 | A1 | * | 6/2008 | Nguyen et al. ............... 438/618 |

FOREIGN PATENT DOCUMENTS

JP 2003-347299 A 12/2003
JP 2006-287022 A 10/2006

* cited by examiner

*Primary Examiner* — Jack Chiang
*Assistant Examiner* — Wilner Jean Baptiste
(74) *Attorney, Agent, or Firm* — Westerman, Hattori, Daniels & Adrian, LLP

(57) ABSTRACT

A method of manufacturing a semiconductor device includes forming a first insulating film over a semiconductor substrate, forming a trench in the first insulating film, forming a metal interconnect in the trench, exposing the surface of the metal interconnect to a silicon-containing gas, performing a plasma treatment of the surface of the metal interconnect after exposing to the silicon-containing gas, and forming a second insulating film over the metal interconnect.

17 Claims, 12 Drawing Sheets

METHOD OF MANUFACTURING A SEMICONDUCTOR DEVICE

BACKGROUND

The multilayer interconnect structures of semiconductor devices in recent years have been increasingly high integration, increased speed, and further miniaturization.

While miniaturization progresses, the spacing between interconnects becomes narrower, and resistance of interconnects and intra-interconnect parasitic capacitance have come to have a major effect on signal transmission rate of the semiconductor device.

In order to avoid the interconnect delay based on interconnect resistance and intra-interconnect parasitic capacitance, there has been a tendency recently to shift from the use of aluminum as an interconnect material to lower resistance copper, and also there has been a trend for the use of low dielectric constant materials for the interlayer insulating layer.

In order to prevent the diffusion of copper in a semiconductor device provided with copper interconnect, for example, a copper barrier film is formed at the interface between the interlayer insulating layer and the copper interconnect. This type of copper barrier layer is formed by the below mentioned production steps.

FIGS. 1A to 1C are cross-sectional drawings of the conventional copper barrier film formation process. These figures show forming the copper interconnect by, for example, the electroplating method in the interlayer insulating layer of low dielectric constant material, and forming the copper barrier film over the copper interconnect.

As shown in FIG. 1A, a native oxide film 102 on the surface of a copper interconnect 101 is removed. Ammonia, for example, is used as the reducing gas. The ammonia is activated by plasma, the surface of the interconnect 101 is exposed to the activated gas, and the native oxide film 102 is removed.

As a pretreatment for formation of the copper barrier film, as shown in FIG. 1B, the surface of the copper interconnect 101 is exposed to silane gas, and a solid solution intermediate layer 103 including silicon is formed on the copper interconnect 101 surface. This intermediate layer 103 functions as an adhesion layer between the copper interconnect 101 and a below described copper barrier film.

As shown in FIG. 1C, plasma Chemical Vapor Deposition (CVD) is used to form a copper barrier film 104 including silicon carbide. The copper barrier film 104 over the copper interconnect 101 prevents the copper diffusing into the interlayer insulating film.

However, reactivity of the silane at the metal surface is high, and there are instance of excessive reaction at the copper interconnect 101 surface. As a result, there are instances of formation of high resistance copper silicide on the surface or interior of the copper interconnect 101. Also there are instances of short circuiting of the copper interconnect 101 due to abnormal growth.

In order to avoid these problems, a method which uses, as a raw material gas for formation of the intermediate layer 103, trimethylsilane is known.

The trimethylsilane suppresses growth of copper silicide, and an amorphous intermediate layer 103 is formed at the interface between the copper barrier layer 104 and the copper interconnect 101.

SUMMARY

A method of manufacturing a semiconductor device according to an aspect of the present invention includes forming a metal interconnect, exposing the surface of the metal interconnect to a silicon-containing gas, performing a plasma treatment of the surface of the metal interconnect after exposing to the silicon-containing gas, and forming a insulating film over the metal interconnect.

BRIEF DESCRIPTION OF THE DRAWINGS

A preferred embodiment of the present invention will be described with reference to the accompanying drawings, wherein.

DETAILED DESCRIPTION OF THE DRAWINGS

Figure 1A:
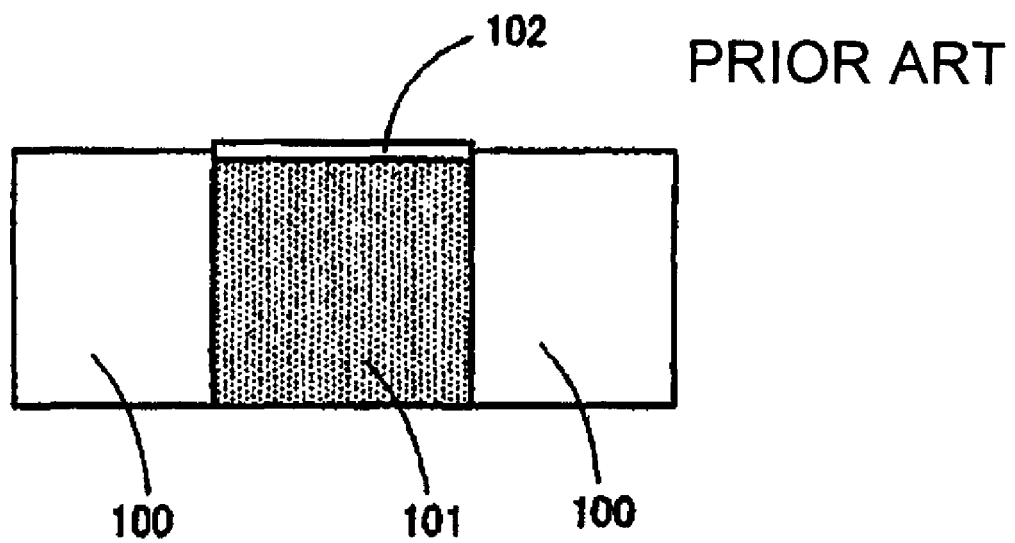
FIGS. 1A to 1C are cross-sectional drawings of the conventional copper barrier film formation process.
Figure 1B:
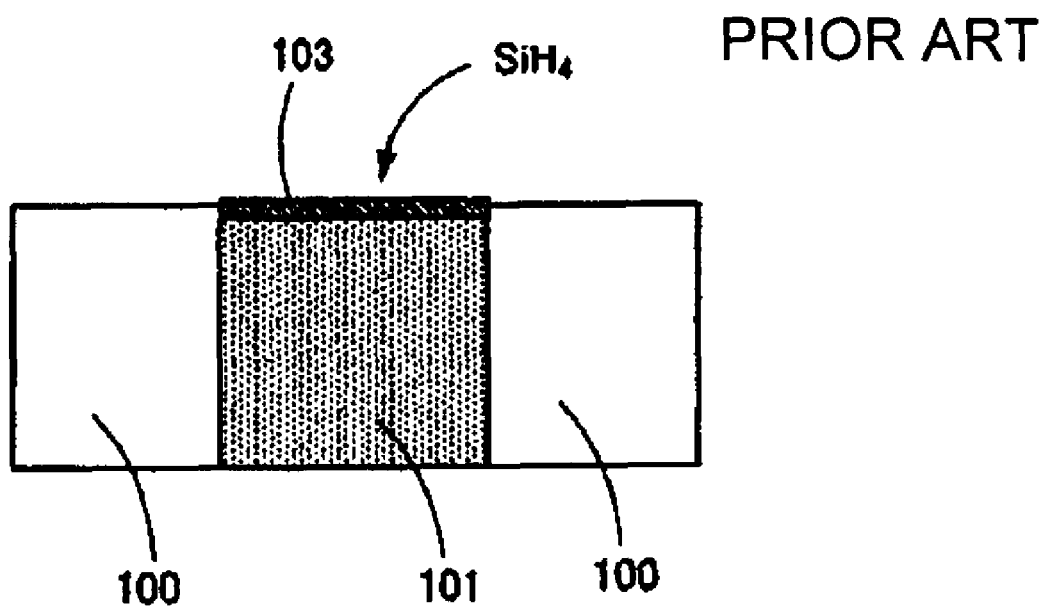
Figure 1C:
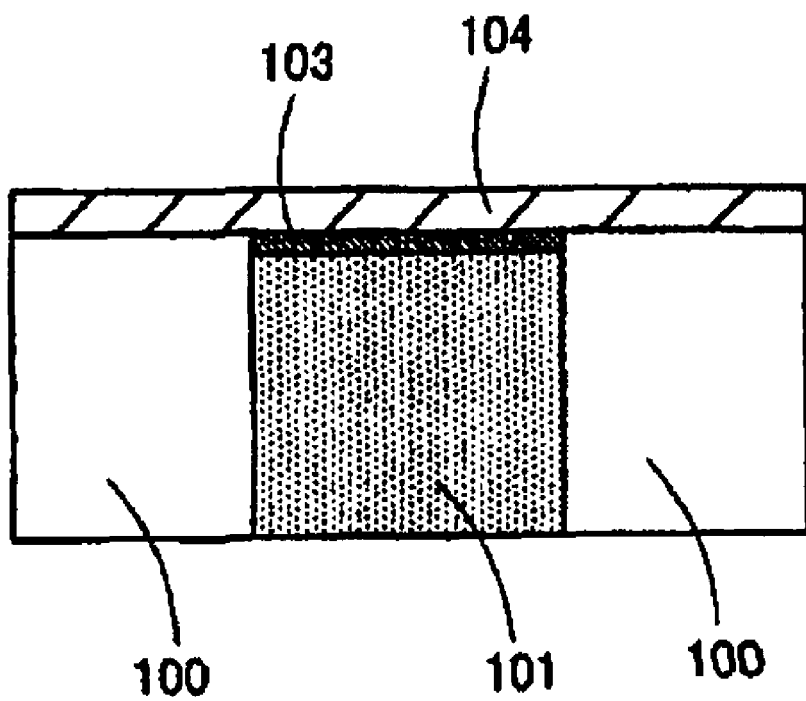
Figure 2:
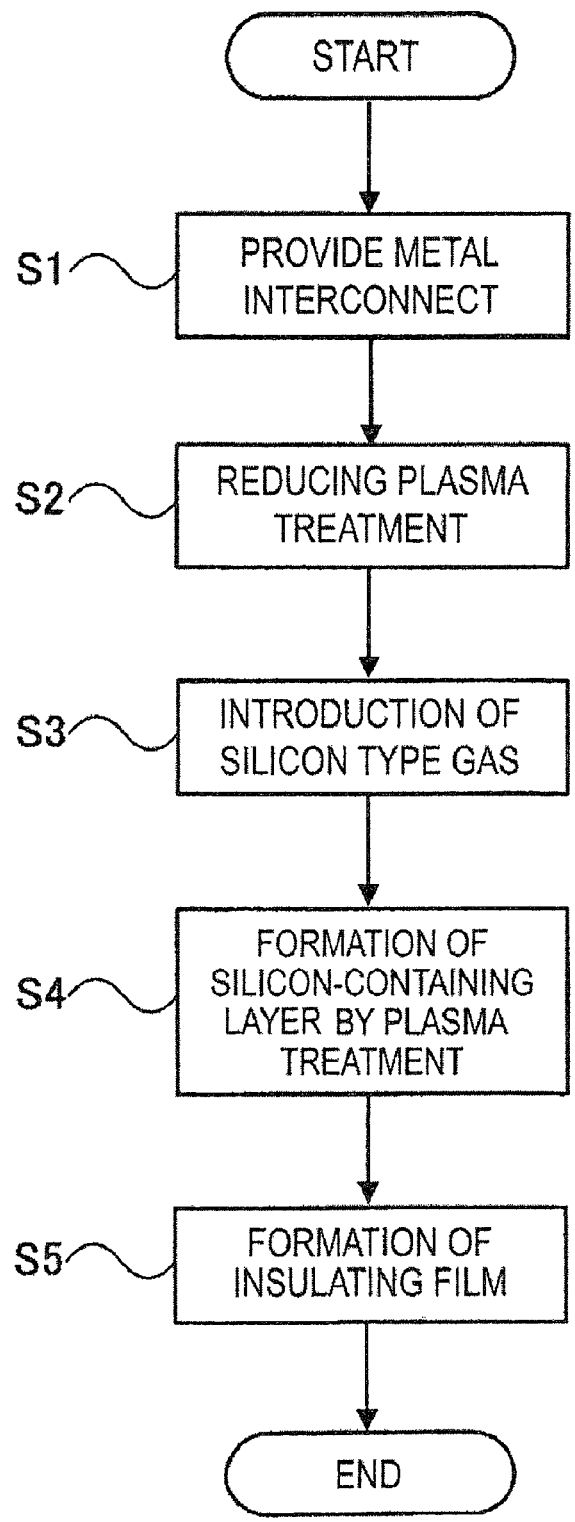
FIG. 2 is a flow chart of the manufacturing method of a semiconductor device.

An embodiment of the present invention is explained below in detail while referring to the above-mentioned figures. FIG. 2 is a flow chart of the manufacturing method of a semiconductor device.

The metal interconnect including copper material is disposed within an interlayer insulating film having a low dielectric constant formed over the semiconductor substrate (step S1). The surface of the metal interconnect disposed within the interlayer insulating film is subjected to reducing plasma treatment (step S2). As a result, the native oxide film formed over the surface of the metal interconnect is removed. This reducing plasma treatment is not a necessary step of the present invention.

The surface of the metal interconnect is exposed to the silicon-containing gas (step S3). The metal interconnect surface is subjected to plasma treatment, and a silicon-containing layer is formed on the metal interconnect (step S4).

A barrier film of the metal interconnect is formed over the silicon-containing layer (step S5). A specific method of the production method for a semiconductor device will be explained below using FIGS. 3A to 3L. Identical items within FIGS. 3A to 3L are assigned the same item identification codes.

A substrate is a semiconductor substrate 11 formed from silicon, gallium arsenide, and the like. Within the semiconductor substrate 11 is formed an element partition region 12 for demarcating the elements in the semiconductor substrate 11. A Metal Oxide Semiconductor (MOS) transistor 20 is formed within an active region determined by the element partition region 12.

Here, the MOS transistor 20 has a source region 13a and a drain region 13b, and a gate electrode 21. The gate length, for example, is about 65 nm. Thickness of the gate insulating film 22, for example, is about 2 nm. In order to operate the MOS transistor 20 at high speed, a low resistance silicide layer, for example cobalt silicide, nickel silicide, is preferably formed over the surfaces of the source region 13a and the drain region 13b and the upper layer of the gate electrode 21.

Over the semiconductor substrate H and the MOS transistor 20, an interlayer insulating film 23 made, for example, from Phosphor Silicate Glass (PSG) of about 1.5 μm thickness is formed by the CVD method Within the interlayer insulating film 23, a contact plug 24 for electrical connection with the source-drain region 13a includes titanium nitride through a barrier metal film 25. The contact plug 24 includes, for example, from tungsten.

Figure 3A:
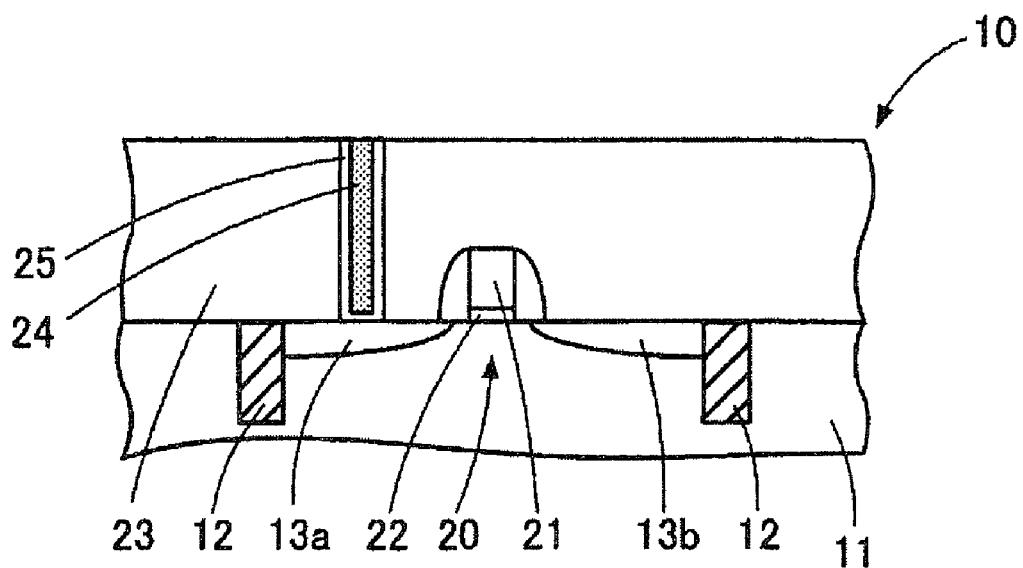
FIGS. 3A to 3L are cross-sectional drawings of the trench part formation process for forming a copper interconnect.
Figure 3B:
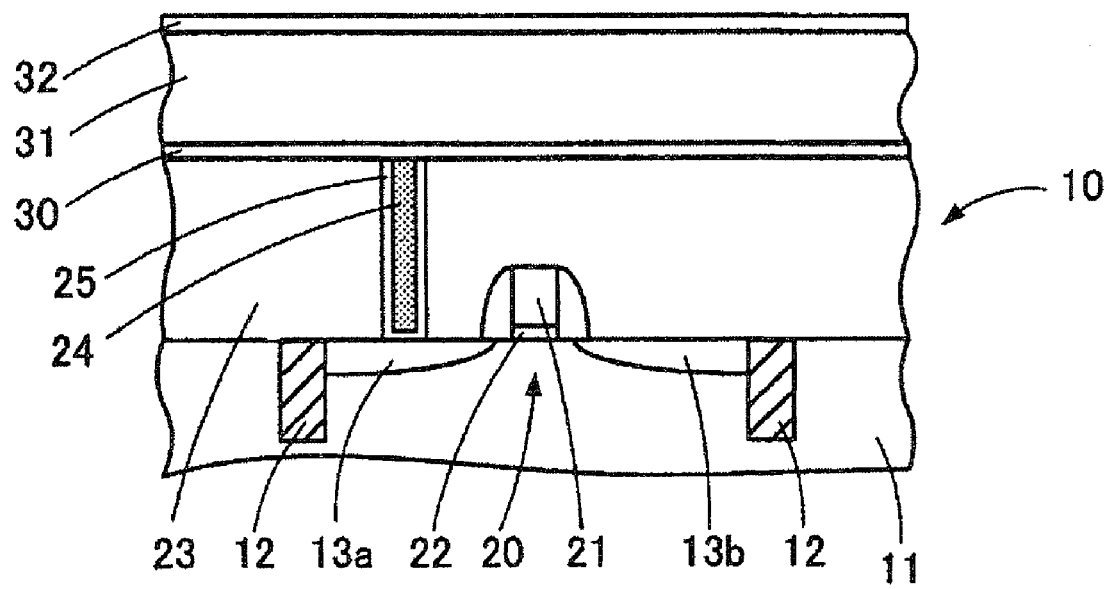

FIG. 3B shows the step of formation of the interlayer insulating film with a low dielectric constant over the interlayer insulating film 23.

A stopper film 30 for the below described etching is formed at a film thickness of about 50 nm over the interlayer insulating film 23. The stopper film 30 includes silicon oxide, carbon-containing silicon oxide, silicon carbide, silicon nitride, and the like.

The spin-on process is used to stack a first low dielectric constant interlayer insulating film 31 of about 250 nm film thickness over the stopper film 30. Here, materials which can be used for the first low dielectric constant interlayer insulating film 31 are MSQ/HSQ mixture hybrid type porous silica (NCS, produced by Catalysts & Chemicals Ind. Co., Ltd.), ALCAP-S® (porous silica, produced by Asahi Kasei Corp.), SiLK® (polyarylene ether, produced by Dow Chemical Co.), FLARE® (polyarylene ether, produced by Allied Signal Corp.), and the like.

Then heat treatment is performed at 250° C. to 400° C. for 1 min. to 30 min. A Chemical Mechanical Polishing (CMP) sacrificial film 32 of about 30 nm film thickness including silicon oxide, for example, is deposited over the first low dielectric constant interlayer insulating film 31.

Figure 3C:
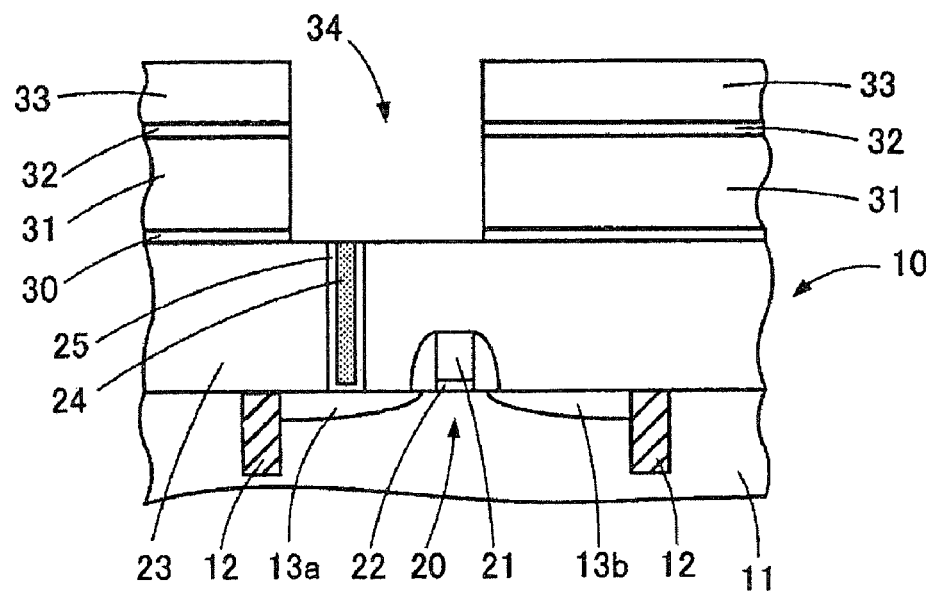

FIG. 3C shows the step of forming the trench part for the copper interconnect. After coating of a photoresist film 33 over the CMP sacrificial film 32, photolithography is used to pattern the photoresist film 33.

Using the patterned photoresist film 33 as a mask, etching is performed, in order, of the CPM sacrificial film 32, the first low dielectric constant interlayer insulating film 31, and the stopper film 30. The contact plug 24 and the surface of the interlayer insulating film 23 are exposed, and an interconnect trench 34 is formed within the first low dielectric constant interlayer insulating film 31.

Here carbon fluoride, for example tetrafruorocarbon, is used as the etching gas during Reactive Ion Etching (RIE) at an input power of about 250 W and a pressure of about 20 mTorr. Thereafter, the photoresist film 33 is removed by ashing.

Figure 3D:
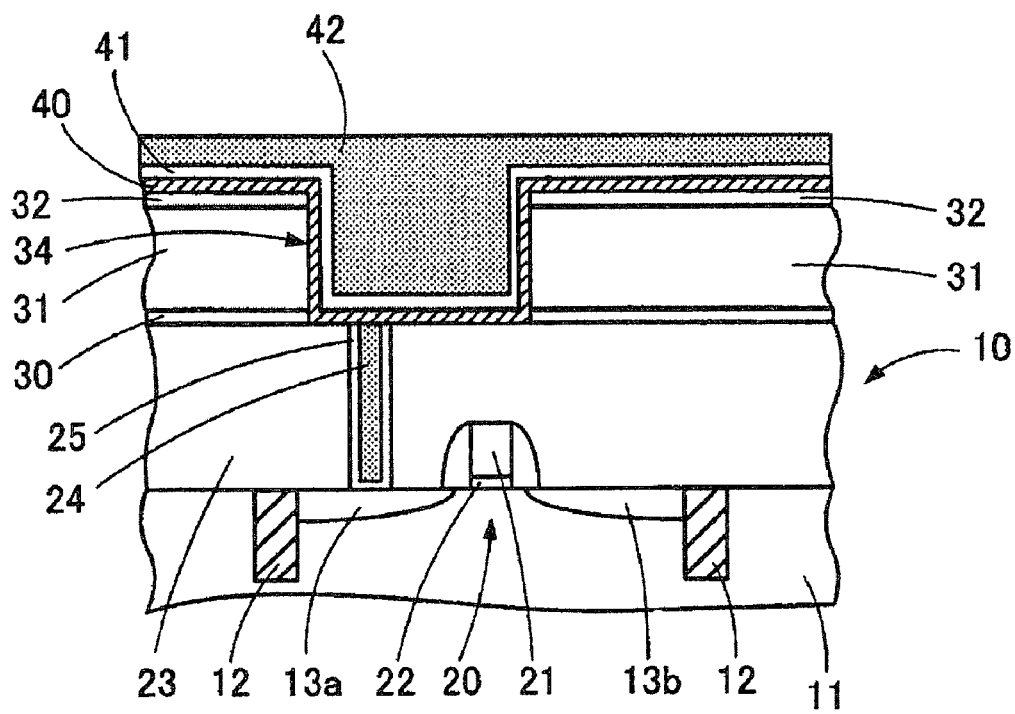

FIG. 3D shows the step of formation of the copper layer within the interconnect trench 34. Within the interconnect trench 34 a barrier metal film 40 of, for example, about 30 nm film thickness is formed. Here the material of the barrier metal film 40 is tantalum, tantalum nitride, titanium, titanium nitride, tungsten, tungsten nitride, zirconium, zirconium nitride, or a stacked layer film of such materials.

The sputtering method is used to form a seed layer 41, for example, of about 30 nm film thickness over the barrier metal film 40. Then a copper layer 42 is formed by the electroplating method, for example, to give a film thickness of about 500 nm over the seed layer 41.

Figure 3E:
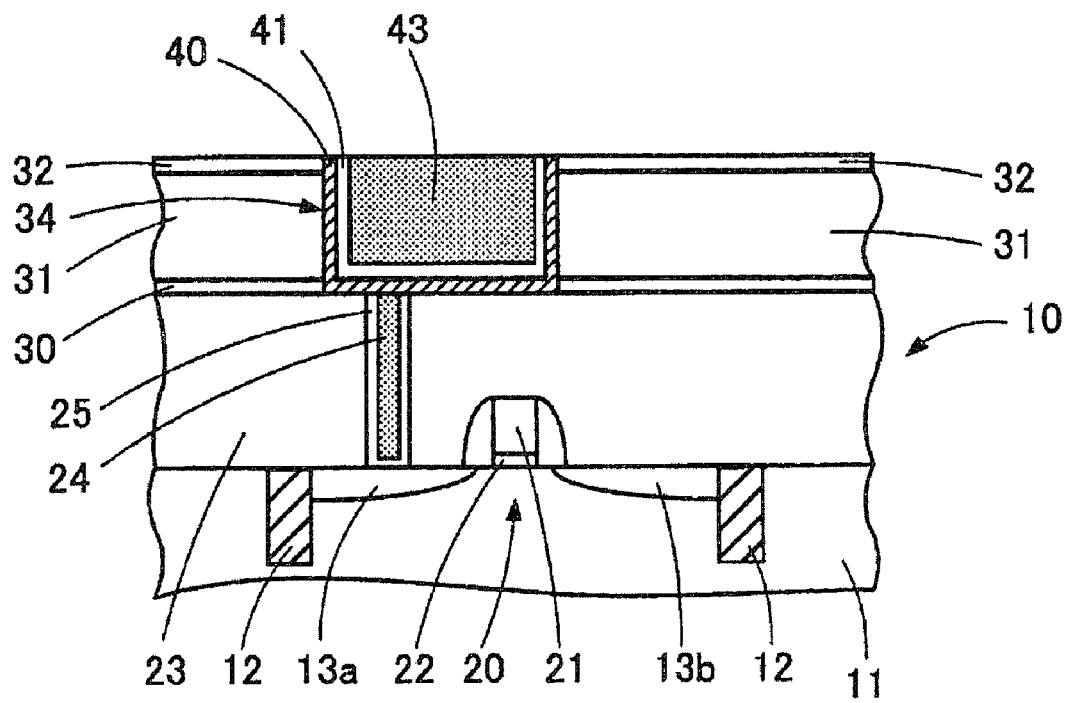

FIG. 3E shows the step of forming the copper interconnect by CMP. The barrier metal film 40, the seed layer 41, and the copper layer 42 formed over the upper face of the CMP sacrificial film 32 are removed by CMP, and a copper interconnect 43 is formed within the interconnect trench 34.

Figure 3F:
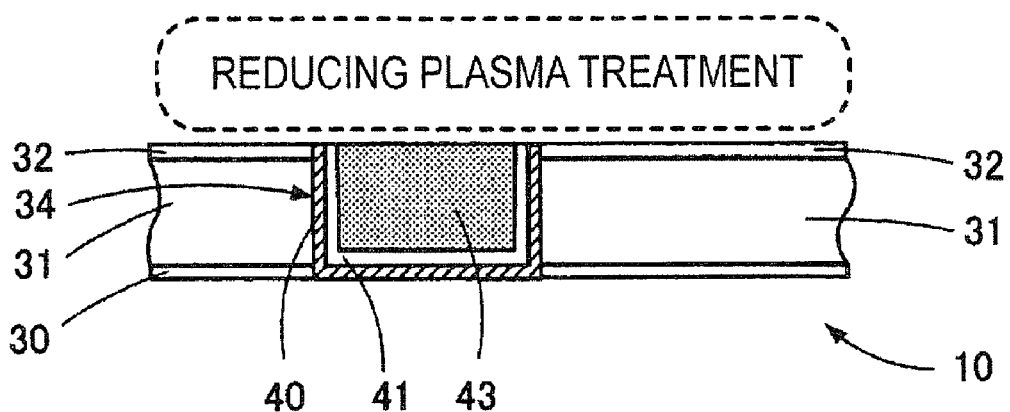

FIG. 3F shows the step of removal of the native oxide film formed over the surface of the copper interconnect 43.

As a pretreatment of the copper interconnect 43, the native oxide film formed over the surface of the copper interconnect 43 is removed. Specifically, a gas including at least one gas selected from among hydrogen and ammonia is activated by a plasma, and the surface of the copper interconnect 43 is exposed to the activated plasma gas to remove the native oxide film. Due to this reducing plasma treatment, the native oxide film is reduced, and the metal surface is exposed.

Here the treatment temperature of the reducing plasma treatment is set to 300° C. to 450° C. In order to match the treatment temperature at the time of the below described formation of the silicon-containing layer, this temperature is preferably set to 350° C. to 400° C. By this means, a temperature adjustment step can be shortened or omitted, and efficiency of semiconductor production is increased.

Figure 3G:
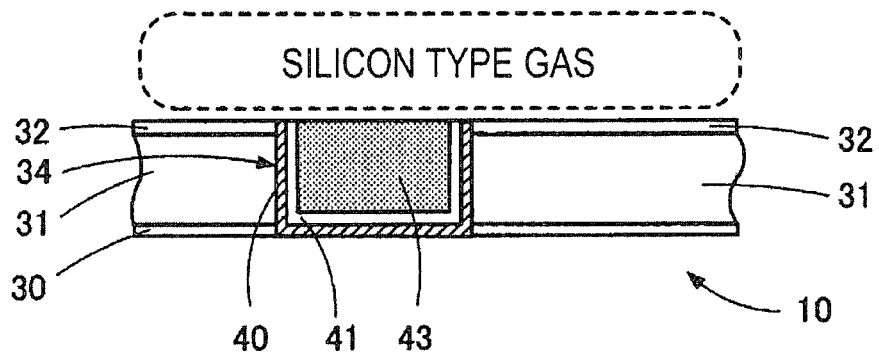

FIG. 3G shows the step of siliconizing the surface of the copper interconnect 43 using a silicon-containing gas. An organic type silane gas is preferably used as the silicon-containing gas. In order to siliconize the surface of the copper interconnect 43, the copper interconnect 43 is exposed to the silicon-containing gas. In particular, the organic type silane gas is characterized by lower reactivity at the metal surface than silane gas and wider process margin in comparison to the silane gas. Thus even in the temperature range of 300° C. to 450° C., the required amount of silicon can be supplied to the surface of the copper interconnect 43 by the adjustment of process conditions.

Here the organic type silane gas is taken to mean a gas for which part of the silane structure is substituted with an organic group. Examples which can be cited are tetramethylsilane (4MS), trimethylsilylacetylene (TMSA), trimethylsilane (3MS), dimethylsilane (2MS), tetramethoxysilane (TMOS), dimethyldimethoxysilane (DMDMOS), tetramethylcyclotetrasiloxane (TMCTS), octamethylcyclotetrasiloxane (OMCTS), dimethyldiethoxysilane (DMDEOS), dimethylphenylsilane (DMPS), diphenyldimethoxysilane (DPDMOS), diphenyldiethoxysilane (DPDEOS), phenyldiethoxysilane (PDEOS), diethoxymethylsilane (DEMS), and the like. At least one of these gases is used for the present embodiment.

Moreover, at least one of gas selected from among a group comprising nitrogen, ammonia, hydrogen, noble gases, hydrocarbons, and the like may be used as a diluent gas for these organic type silane gases. Total pressure of the organic type silane gas or gas mixture of diluent gas and organic type silane gas is 0.5 Torr to 50 Torr.

For example, taking as an example the use of nitrogen to dilute tetramethylsilane, the flow rate ratio of tetramethylsilane/nitrogen is set to about 1000 sccm/9000 sccm, and pressure is set to about 1.5 Torr.

Moreover, the diluted gas exposure treatment time interval is set to 1 sec. to 60 sec. In order to suppress excessive growth of silicon itself including silicon microcrystallite growth and amorphous silicon growth, the diluted gas exposure treatment time interval is preferably set to about 10 sec.

Due to such treatment, a selective reaction occurs between the surface of the copper interconnect 43 and the silicon-containing gas. The surface of the copper interconnect 43 is subjected to plasma treatment under prescribed conditions.

Figure 3H:
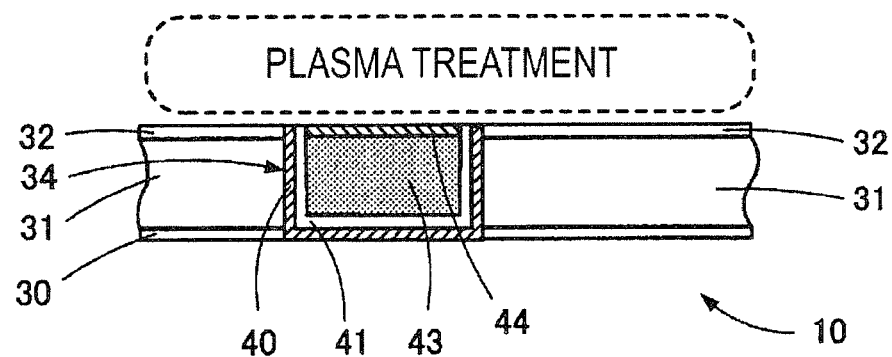

FIG. 3H shows the step of performance of plasma treatment of the surface of the siliconized surface of the copper interconnect. Here the treatment apparatus used for plasma treatment according to the present working example is a capacitively coupled plasma treatment apparatus equipped with a top electrode and bottom electrode, although a different form of apparatus may be used for plasma treatment.

The top electrode is an electrode provided with a shower plate structure, and an alternating current can be applied to the top electrode. The gas used for plasma treatment is able to be fed from multiple pinholes of the top electrode toward the bottom electrode.

The bottom electrode is an electrode provided with a stage structure for support of the semiconductor substrate 11. By application of an AC voltage or DC voltage to the bottom electrode, a bias voltage can be applied to the semiconductor substrate 11. Specifically during plasma treatment, the semiconductor substrate 11 having the siliconized copper interconnect 43 is first placed on the bottom electrode. Then the gas used for plasma treatment is introduced into the plasma treatment apparatus.

The gas used here for plasma treatment includes at least one of gas selected from a group consisting of nitrogen, ammonia, dinitrogen monoxide, carbon dioxide, oxygen, hydrogen, noble gases, and hydrocarbons. The gas used as a base gas includes at least one of gas from among nitrogen, ammonia, hydrogen, noble gases, and hydrocarbons; and total pressure is set to 0.5 Torr to 50 Torr.

For example, in the case of selection of a mixed gas of ammonia and nitrogen as the treatment base gas, the ammonia/nitrogen flow ratio is about 4000 sccm/1600 sccm, and pressure is adjusted to about 2.3 Torr.

Since the dinitrogen monoxide, carbon dioxide, and oxygen are more highly oxidizing than the other gases, these gases may possibly damage the surface of the copper interconnect 43. Thus after performance of plasma treatment using the above mentioned base gas, the dinitrogen monoxide, carbon dioxide, or oxygen is used by addition to the base gas of least one type of gas selected from among dinitrogen monoxide, carbon dioxide, and oxygen, and total pressure is set to 0.5 Torr to 50 Torr.

Moreover, the treatment temperature is set to 300° C. to 450° C. In order to match the treatment temperature at the time of the below described copper barrier film formation, this temperature is preferably set to 350° C. to 400° C.

The gas used for plasma treatment is activated by application of a mono-frequency to the top electrode, or by application of an AC voltage of a different frequency to the bottom electrode or the top electrode. For example, in the case of application of a mono-frequency AC voltage to the top electrode, an AC voltage is applied to the top electrode to cause a high frequency (10 MHz to 300 MHz) AC voltage of 0.02 $W \cdot cm^{-2}$ to 0.8 $W \cdot cm^{-2}$ to be applied to the semiconductor substrate 11.

In the case of application of AC voltages of different frequencies to the top electrode and the bottom electrode, an AC voltage is applied to the top electrode to cause a high frequency AC voltage of 0.02 $W \cdot cm^{-2}$ to 0.8 $W \cdot cm^{-2}$ to be applied to the semiconductor substrate 11, and an AC voltage is applied to the bottom electrode to cause a low frequency wave (100 kHz to 500 kHz) AC voltage of less than about 1.6 $W \cdot cm^{-2}$ to be applied to the semiconductor substrate 11.

In order to prevent damage to the copper interconnect 43 and the first low dielectric constant interlayer insulating film 31 due to ion bombardment during plasma treatment, plasma treatment is preferably performed at a high frequency AC voltage of lower power.

Specifically, while applying an AC voltage to the top electrode so as to apply an AC voltage (13.56 MHz frequency) of 0.02 $W \cdot cm^{-2}$ to 0.4 $W \cdot cm^{-2}$ to the semiconductor substrate 11, the treatment time interval is set less than or equal to about 20 sec. During this time interval, voltage is not applied to the bottom electrode.

A silicon-containing layer 44 is formed over the surface of the copper interconnect 43 by such a plasma treatment. This plasma treatment is adjusted such that the layer thickness of the silicon-containing layer 44 becomes 0.1 nm to 10 nm. The layer thickness of the silicon-containing layer 44 is preferably adjusted to 0.1 nm to 3.0 nm in order to prevent excessively high resistance of the copper interconnect 43 including the silicon-containing layer 44. The time interval of performance of treatment is 3 sec. to 60 sec.

Ingredients of the silicon-containing layer 44 and the concentrations thereof can be varied by adjustment of treatment conditions or the combination of gases used for plasma treatment. For example, there are instances when the non-silicon ingredients included in the silicon-containing layer 44 are copper, oxygen, nitrogen, and carbon; and there are also instances when the non-silicon ingredients included in the silicon-containing layer 44 are copper, oxygen, and carbon.

Figure 3I:
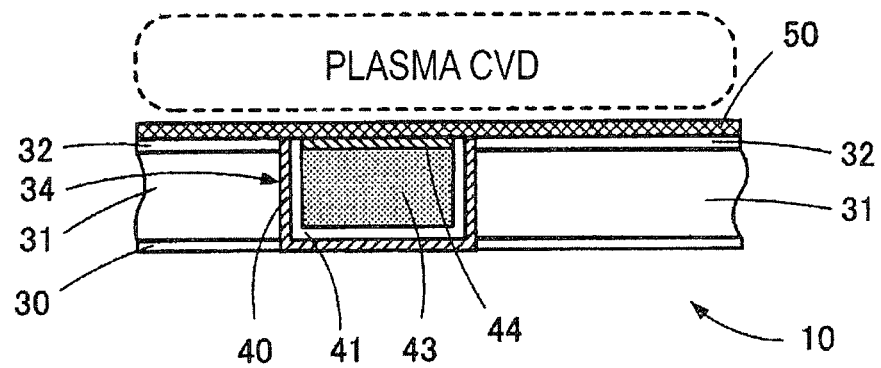

By adjustment of such ingredients of this type of silicon-containing layer 44, control is possible, of adhesion between the copper interconnect 43 and the copper barrier film. FIG. 3I shows the step of formation of the copper barrier film over the silicon-containing layer.

The copper barrier film 50 is formed over the silicon-containing layer 44 by plasma CVD. Treatment temperature here is set to 300° C. to 450° C. In order to perform treatment at the same temperature during the series of steps of FIGS. 3F to 3I, temperature is preferably set to 350° C. to 400° C.

The raw material gas used during plasma CVD includes at least one of organic type silane gas (e.g., tetramethylsilane, trimethylsilylacetylene, trimethylsilane, dimethylsilane, tetramethoxysilane, dimethyldimethoxysilane, tetramethylcyclotetrasiloxane, octamethylcyclotetrasiloxane, dimethyldiethoxysilane, dimethylphenylsilane, diphenyldimethoxysilane, diphenyldiethoxysilane, phenyldiethoxysilane, diethoxymethylsilane, and the like) diluted with oxygen, carbon dioxide, or a mixed gas of oxygen and carbon dioxide. Furthermore, a gas may be used containing nitrogen added to this diluent gas.

Here the component of the copper barrier film 50 includes at least one of insulator selected from a group consisting of silicon nitride, oxygen-containing silicon carbide, nitrogen-containing silicon carbide, silicon carbide, and carbon-containing silicon oxide.

In order to lower the parasitic capacitance between copper interconnects, the copper barrier film 50 is preferably formed using at least one of insulator, having a lower dielectric constant, selected from among a group consisting of oxygen-containing silicon carbide, nitrogen-containing silicon carbide, silicon carbide, and carbon-containing silicon oxide. Alternatively, the plasma CVD method may be used to form a boron nitride film.

In order to control the overall dielectric constant and to provide barrier performance, thickness of this film is preferably set to 5 nm to 70 nm and more preferably 10 nm to 30 nm.

When there is a desire to suppress excessive adhesion between the copper interconnect 43 and the copper barrier film 50, an amorphous silicon layer may be formed between the silicon-containing layer 44 and the copper barrier film 50. When the amorphous layer is formed, excess adhesion between the silicon-containing layer 44 and the copper barrier film 50 is suppressed, and resistance to stress migration of the semiconductor device is thought to further improve.

According to the present embodiment, silicon is provided by causing the organosilane to flow upon the copper interconnect 43 surface. Then plasma treatment is used to form the silicon-containing layer 44, and the copper barrier film 50 is formed thereon.

Copper interconnect 43 has crystal grain boundaries, and there are instances when minute vacancies are present at the crystal grain boundaries. There is concern that such holes move along the crystal grain boundaries and concentrate at the copper interconnect surface to form voids. The void has a major impact on reliability.

Silicon supplied to the surface of the copper interconnect 43 may invade the crystal grain boundaries and may has a trapping function preventing movement of vacancies along the crystal grain boundaries. However, silicon itself supplied to the copper interconnect surface by conventional technology diffuses into the copper interconnect, that there is a possibility of that the above mentioned trapping function will be not be sufficiently expressed.

It is thought that, in contrast to when plasma treatment is performed after the supply of silicon to the copper interconnect surface, the silicon may be fixed due to the silicon having some sort of bonded state, and thus movement of holes on the crystal grain boundary is suppressed by that above mentioned trapping function.

As a result, it is thought that generation of voids at the copper interconnect 43 surface due to stress migration is controlled, and electrical reliability of the semiconductor device is improved.

The series of production steps indicated by FIGS. 3F to 3I may be performed continuously within a temperature range of 300° C. to 450° C. Alternatively, the series of production steps indicated by FIGS. 3F to 3I may be performed continuously at a fixed temperature within a temperature range of 300° C. to 450° C.

The position of formation of the silicon-containing layer 44 in this manner is not limited to just upon the surface of the copper interconnect 43, and this layer can also be formed at another position by layer stacking upon an upper layer.

The production process for formation of the silicon-containing layer at another position by layer stacking upon an upper layer of the copper interconnect 43 will next be explained.

Figure 3J:
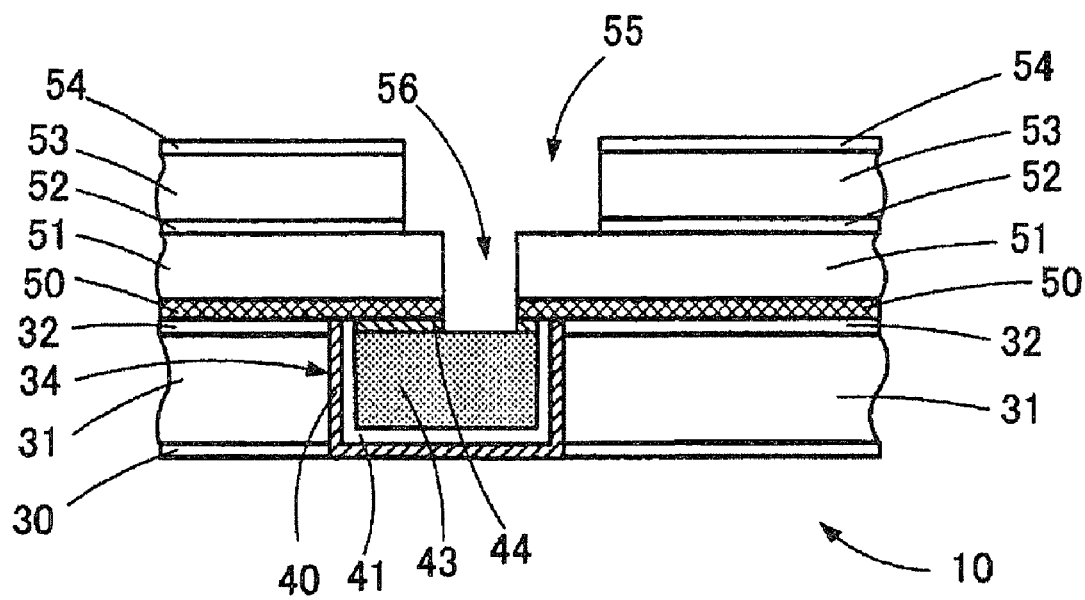

FIG. 3J shows the step of formation of an interconnect trench and a trench part for placement and burial of a contact hole and interconnect.

Upon the copper barrier film 50 is formed a second low dielectric constant interlayer insulating film 51 of about 250 nm film thickness using the same production method and ingredients as the first low dielectric constant interlayer insulating film 31. Upon the second low dielectric constant interlayer insulating film 51 is formed a stopper film 52 of about 30 nm thickness. The stopper film 52 is, for example, silicon oxide.

Then upon the stopper film 52 is formed a third low dielectric constant interlayer insulating film 53 of about 170 nm film thickness using the same production method and ingredients as the first low dielectric constant interlayer insulating film 31. Furthermore, upon the third low dielectric constant interlayer insulating film 53 is formed a CMP sacrificial film 54 of about 50 nm thickness. The CMP sacrificial film 54 is, for example silicon oxide.

Then as illustrated, an interconnect trench 55 is formed in the third low dielectric constant interlayer insulating film 53, and a contact hole 56 is formed in the second low dielectric constant interlayer insulating film 51.

Figure 3K:
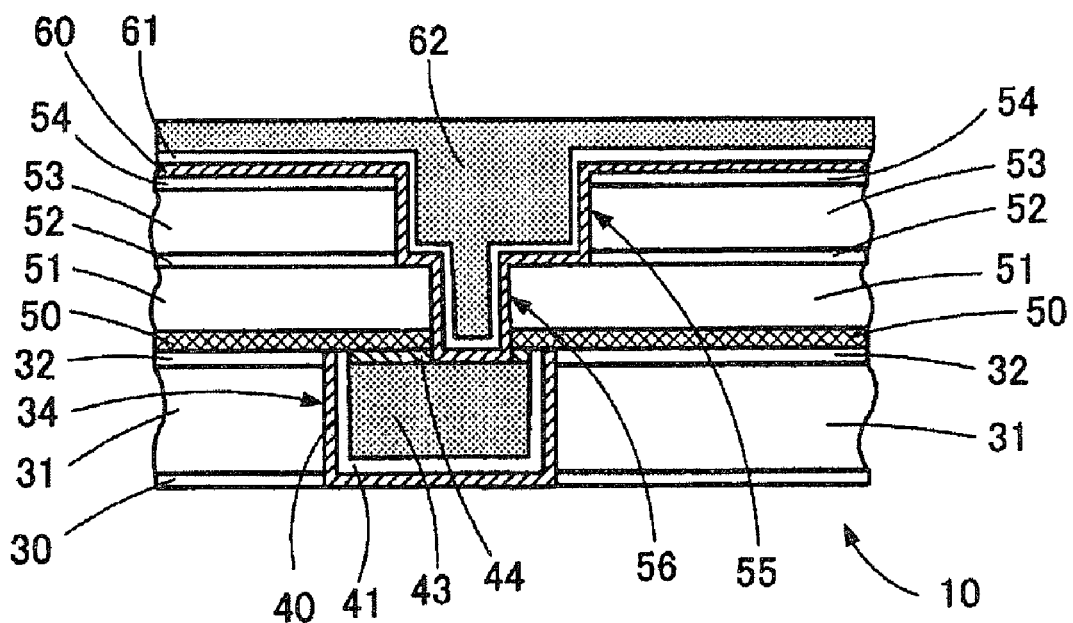

FIG. 3K shows the step of providing a copper layer within the interconnect trench 55 and the contact hole 56 by electroplating. After formation of a barrier metal film 60 on the inner walls of the interconnect trench 55 and the contact hole 56, a seed layer 61 is formed. The barrier metal film 60 is, for example, tantalum. Then a copper layer 62 is formed in the interconnect trench 55 and the contact hole 56 by electroplating to electrically connect together the copper layer 62 and the copper interconnect 43.

Figure 3L:
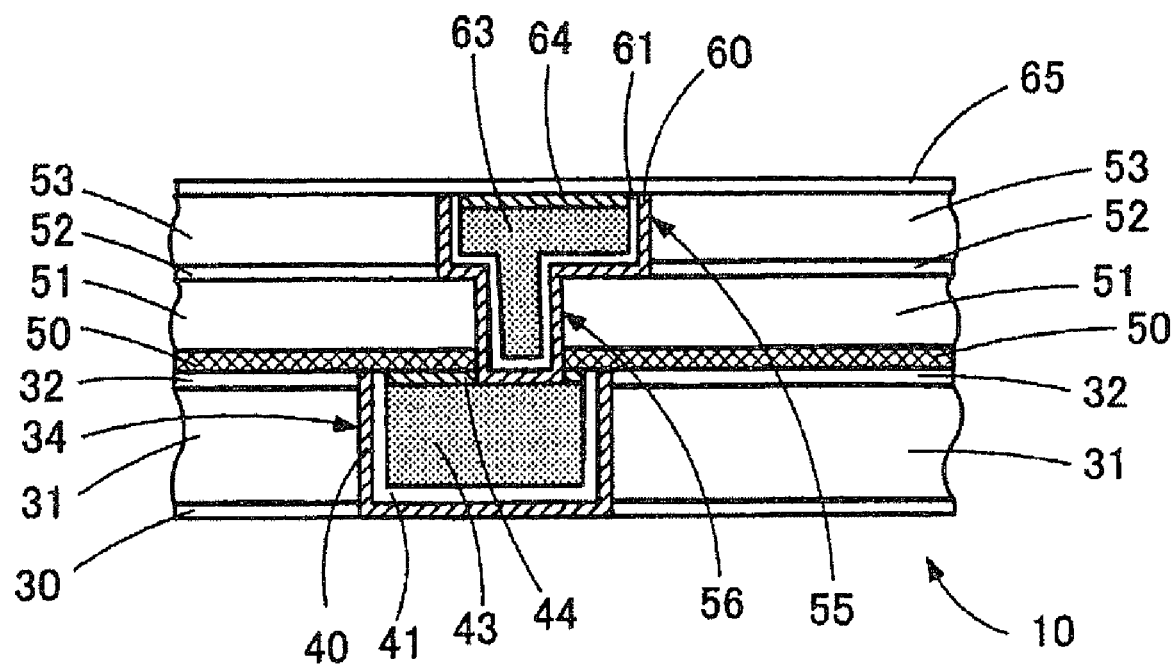

FIG. 3L shows the step of formation of the copper barrier film over the copper interconnect. After polishing by CMP until the surface of the third low dielectric constant interlayer insulating film 53 is exposed, a copper interconnect 63 is disposed within the third low dielectric constant interlayer insulating film 53. Then a copper barrier film 65 is formed over the silicon-containing layer 64. The ingredient of this copper barrier film 65 is an insulator which includes at least one selected from among a group consisting of silicon nitride, oxygen-containing silicon carbide, nitrogen-containing silicon carbine, silicon carbine, and carbon-containing silicon oxide.

However, in order to lower the parasitic capacitance between the copper interconnects, the copper barrier film 65 is preferably formed using at least one of insulator, having a lower dielectric constant, selected from among a group consisting of oxygen-containing silicon carbide, nitrogen-containing silicon carbide, silicon carbide, and carbon-containing silicon oxide. Alternatively, the plasma CVD method may be used to form a boron nitride film which has a low dielectric constant.

The position of formation of the silicon-containing layer in this manner is not limited to just upon the surface of the copper interconnect 43 provided in the first low dielectric constant interlayer insulating film 31, and this layer can also be formed at another position, i.e., on the surface of the copper interconnect 63 provided in the third low dielectric constant interlayer insulating film 53.

Moreover, no particular limitation is placed on the order of interconnect formation using the damascene method applicable for formation of the silicon-containing layer, or formation of the contact hole 56 in the second low dielectric constant interlayer insulating film 51 as shown in FIG. 3J after formation of the interconnect trench 55 in the third low dielectric constant interlayer insulating film 53.

Interconnects 43 and 63 may include other materials such as alloys of copper with other metals, tungsten, alloys of tungsten with other metals, and the like.

An organosilane is introduced to the surface of the metal interconnect which had been subjected to reducing plasma treatment, and thereafter the plasma treatment shown in FIG. 3H is performed. The organosilane is, for example, 4MS.

Two types of semiconductor devices, pluralities of semiconductor devices A and semiconductor devices B, were produced by wafer processing to make this comparison. The semiconductor device A is a semiconductor device produced according to the flow chart shown in FIG. 2. Specifically, organic type silane gas is introduced to the surface of a metal interconnect having been subjected to reducing plasma treatment. Thereafter, the plasma treatment shown in FIG. 3H is performed, and the above mentioned silicon-containing layer is formed within the semiconductor device.

The semiconductor device B has a silicon-containing layer formed within the semiconductor device while omitting the plasma treatment shown in FIG. 3H from the flow chart shown in FIG. 2.

Removal of the native oxide film formed over the copper interconnect surfaces of the semiconductor device A and the semiconductor device B, formation of the silicon containing layer, and formation of the copper barrier film, were performed consecutively under roughly 400° C. temperature conditions. Also oxygen-containing silicon carbide film was formed as the copper barrier film.

Figure 4:
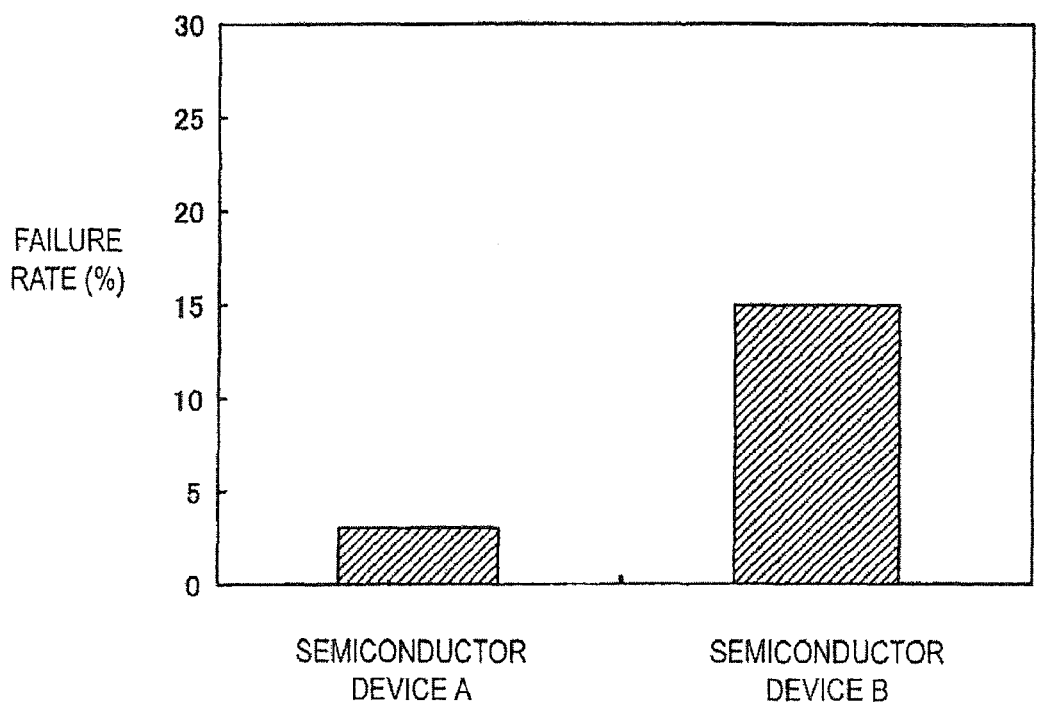
FIG. 4 is result of a comparison of failure rates of semiconductor devices.

FIG. 4 is chart of failure rate of the semiconductor device. The horizontal axis of this chart indicates the sample type. The vertical axis indicates failure rate (%) of multiple semiconductor devices.

For example, in contrast to the failure rate of about 3 percent for the semiconductor device A, the failure rate of the semiconductor device B became 15%. Thus the semiconductor device A was found to have improved stress migration resistance and a much lower failure rate.

Figure 5:
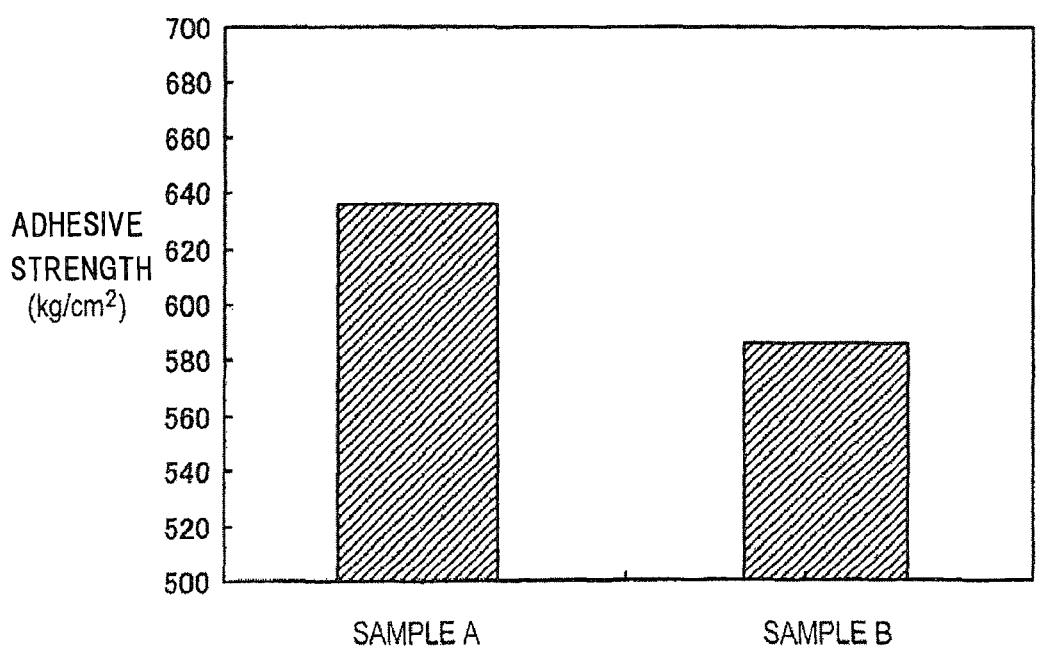
FIG. 5 is result of adhesion test.

FIG. 5 is the result of an adhesion test. The horizontal axis of this chart indicates the sample type. The vertical axis indicates adhesive strength (kg/cm$^2$). For adhesion test, a simulation sample A corresponding to the above mentioned semiconductor device A and a simulation sample B corresponding to the semiconductor device B were produced, and these simulation samples were evaluated.

For sample A, an interlayer insulating film was formed over the silicon wafer, and organic type silane gas was introduced to the substrate provided with a copper interconnect within the interlayer insulating film. The plasma treatment explained using FIG. 3H was performed, the above mentioned silicon-containing layer was formed between the copper interconnect and the copper barrier film, and the above mentioned copper barrier film was further formed.

For sample B, an interlayer insulating film was formed over the silicon wafer, and organic type silane gas was introduced to the substrate provided with a copper interconnect within the interlayer insulating film. The plasma treatment explained using FIG. 3H was omitted, the silicon-containing layer was formed between the copper interconnect and the copper barrier film, and the above mentioned copper barrier film was further formed.

In contrast to the adhesive strength of about 636 kg/cm$^2$ of the sample A, the adhesive strength of the sample B was about 586 kg/cm$^2$.

Figure 6:
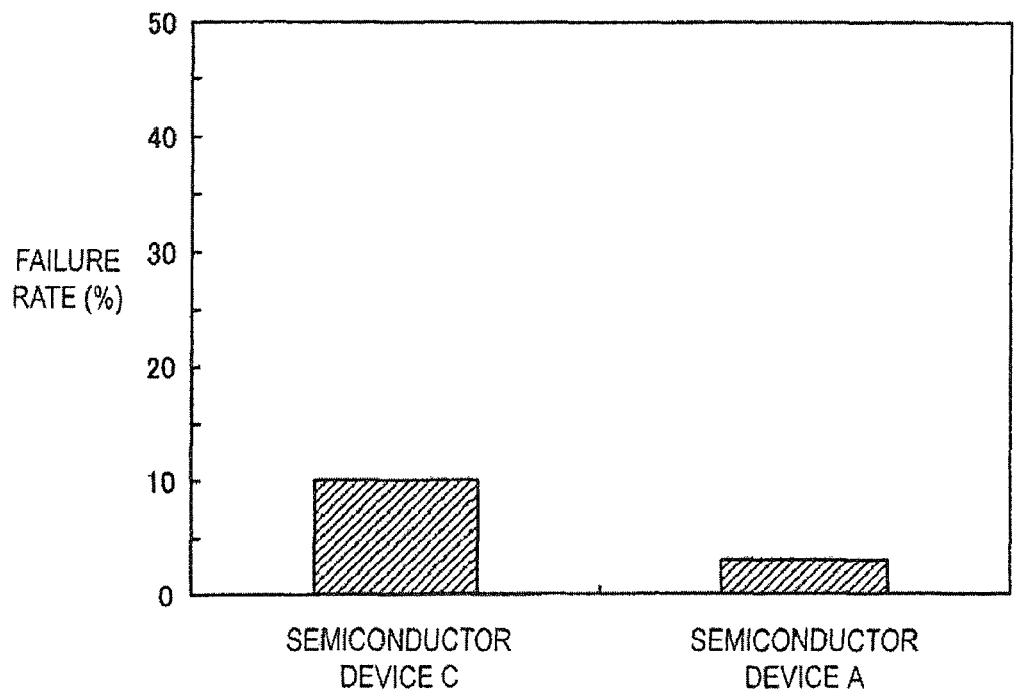
FIG. 6 is result of a comparison of failure rates of semiconductor devices.

FIG. 6 is result of a comparison of failure rates of semiconductor devices. The horizontal axis of this chart indicates the sample type, and the vertical axis indicates failure rate (%) of multiple semiconductor devices.

The semiconductor device C and the semiconductor device A shown in this chart were both produced according to the flow chart shown in FIG. 2, during the plasma treatment shown in FIG. 3H, the semiconductor C was produced, together with application of a high frequency AC voltage to the top electrode, by application of a low frequency AC voltage to the bottom electrode such that an auto-bias was applied to the substrate. While in the plasma treatment shown in FIG. 3H for the semiconductor device A, plasma treatment was performed by application of a high frequency AC voltage only to the top electrode.

In contrast to the failure rate of about 3 % for the semiconductor device A, the failure rate of the semiconductor device C increased to 10%.

A comparison was made between the case of formation of the silicon-containing layer using an inorganic type silane gas and the case of formation of the silicon-containing layer using an organic type silane gas.

In order to make this comparison, the above mentioned silicon-containing layer was formed using inorganic silane gas to produce a plurality of semiconductor devices D by wafer processing rather than the use of organic type silane gas during step S3 of FIG. 2, production of a semiconductor device by exposure to inorganic type silane gas. Also the above mentioned silicon-containing layer was formed using organic type silane gas to produce a plurality of semiconductor devices A formed by the flow chart of FIG. 2, and the 2 types of samples were subjected to comparison testing.

Removal of the native oxide film formed over the copper interconnect surfaces of the semiconductor device A and the semiconductor device D, formation of the silicon containing layer, and formation of the copper barrier film, were performed consecutively under roughly 400° C. temperature conditions. Also an oxygen-containing silicon carbide film was formed as the copper barrier film.

Figure 7:
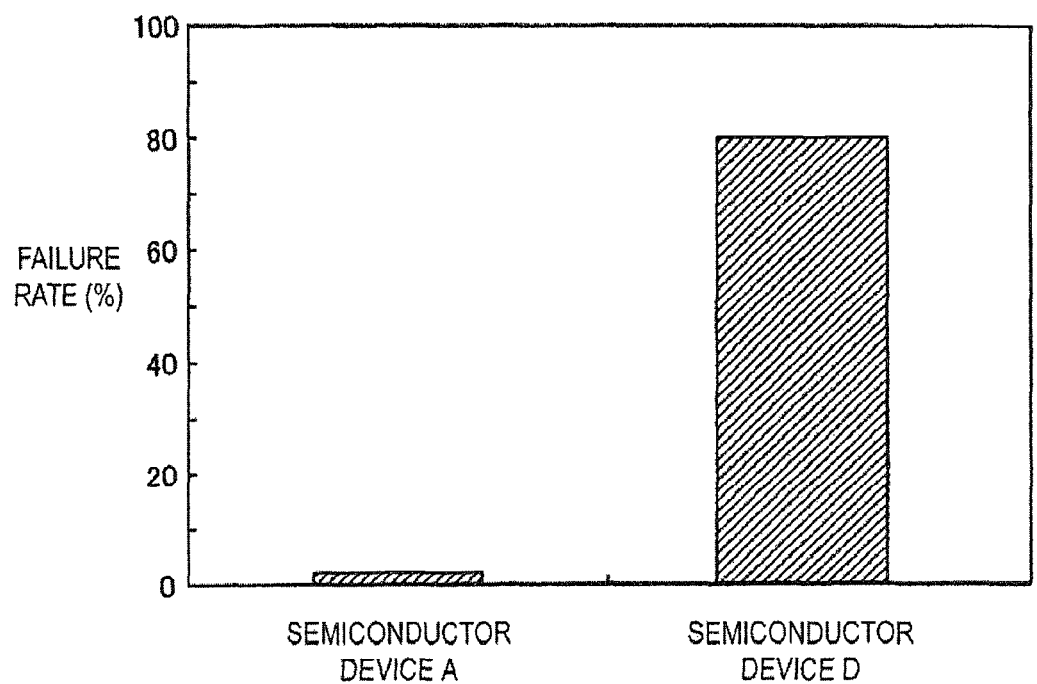
FIG. 7 is result of a comparison of failure rates of semiconductor devices.

FIG. 7 is chart of failure rate of the semiconductor device. The horizontal axis of this chart indicates the sample type. The vertical axis indicates failure rate (%) of multiple semiconductor devices.

For example, in contrast to the failure rate of about 3 % for the semiconductor device A, the failure rate of the semiconductor device D was 80%.

Figure 8A:
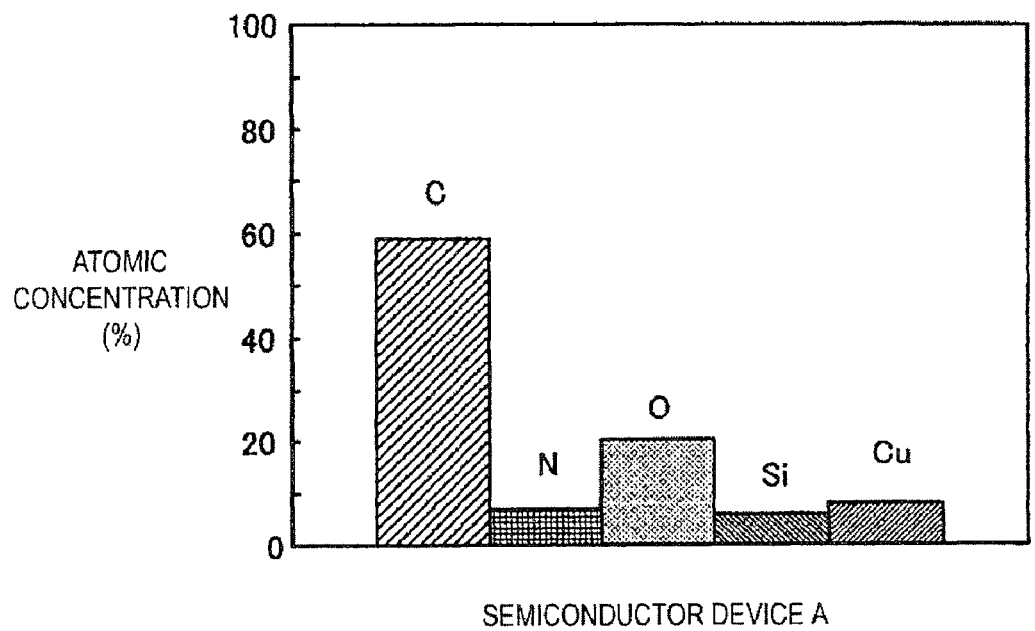
FIGS. 8A and 8B are diagrams each showing an example of the composition of the silicon-containing layer.
Figure 8B:
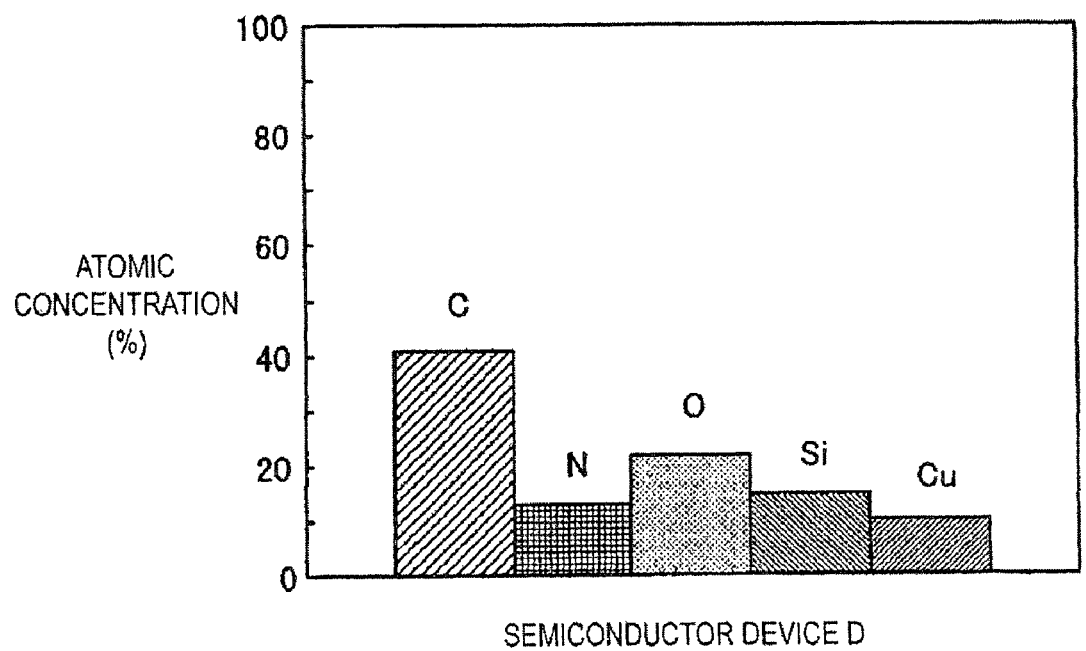

FIG. 8A is diagrams showing an example of the composition of the silicon-containing layer of the semiconductor device A, and FIG. 8B is diagrams showing an example of the composition of the silicon-containing layer of the semiconductor device D. Compositions for these figures were analyzed by X-ray Photoelectron Spectroscopy (XPS).

For example, although both the semiconductor device A and the semiconductor device D contained carbon, nitrogen, oxygen, silicon, and copper, the silicon and copper contents were higher for the semiconductor device D than for the semiconductor device A.

In line with the lowering of failure rate (%) of the semiconductor device A versus the semiconductor device D, variance of the failure rate (%) and the like of the semiconductor device is thought to depend on the content of the silicon-containing layer.

By adjustment of production conditions during formation of the silicon-containing layer on the copper interconnect surface to control composition of the silicon-containing layer, it was found that adhesivity was improved and that it was possible to improve failure rate and lifetime increase rate of the semiconductor device.

According to this production method for a semiconductor device of the present embodiment, electrical reliability of the semiconductor device is improved. Manufacturability of the semiconductor device can also be improved.

We claim:

1. A method of manufacturing a semiconductor device comprising:

forming a first insulating film over a semiconductor substrate;

forming a trench in the first insulating film;

forming a first metal interconnect including copper in the trench;

exposing the upper surface of the metal interconnect to an organic type silane gas and siliconizing the upper surface of the metal interconnect;

after exposing of the upper surface of the first metal interconnect to the organic type silane gas, performing a plasma treatment to the siliconized surface of the first metal interconnect to form a silicon-containing layer including silicon and copper in the upper surface of the first metal interconnect;

after performing of the plasma treatment, forming a second insulating film on and in contact with the silicon-containing layer; and forming a second metal interconnect in the second insulating film and in contact with the upper surface of the first metal interconnect, wherein the plasma treatment is performed using at least one selected from a group consisting of nitrogen, hydrogen, dinitrogen monoxide, carbon dioxide, oxygen, and hydrocarbons.

2. The method according to claim 1, further comprising:
performing a reducing plasma treatment of the first metal interconnect after forming the metal interconnect and prior to exposing to the silicon-containing gas.

3. The method according to claim 2, wherein the reducing plasma treatment is performed at 300° C. to 450° C.

4. The method according to claim 1, wherein the organic type silane gas includes at least one selected from a group consisting of tetramethylsilane, trimethylsilylacetylene, trimethylsilane, dimethylsilane, tetramethoxysilane, dimethyldimethoxysilane, tetramethylcyclotetrasiloxane, octamethylcyclotetrasiloxane, dimethyldiethoxysilane, dimethylphenylsilane, diphenyldimethoxysilane, diphenyldiethoxysilane, phenyldiethoxysilane, and diethoxymethylsilane.

5. The method according to claim 1, wherein the surface of the metal interconnect is exposed to the silicon-containing gas after dilution of the silicon-containing gas with at least one selected from a group consisting of nitrogen, ammonia, hydrogen, noble gases, and hydrocarbons.

6. The method according to claim 1, wherein a time interval of exposing of the upper surface of the first metal interconnect to the silicon-containing gas is 1 sec. to 60 sec.

7. The method according to claim 1, wherein a time interval of the plasma treatment is 3 sec. to 60 sec.

8. The method according to claim 1, wherein
the first metal interconnect includes copper, and
a silicon-containing layer containing copper, silicon, oxygen, nitrogen, and carbon is formed over the first metal interconnect by the plasma treatment.

9. The method according to claim 8, wherein a layer thickness of the silicon-containing layer is 0.1 nm to 10 nm.

10. The method according to claim 1, wherein
the first metal interconnect includes copper, and
a silicon-containing layer containing copper, silicon, oxygen, and carbon is formed over the first metal interconnect by the plasma treatment.

11. The method according to claim 10, wherein a layer thickness of the silicon-containing layer is 0.1 nm to 10 nm.

12. The method according to claim 1, wherein the second insulating film includes at least one selected from a group consisting of silicon nitride, oxygen-containing silicon carbide, nitrogen-containing silicon carbide, silicon carbide, carbon-containing silicon oxide, and boron nitride.

13. The method according to claim 1,
a first AC voltage is applied to a top electrode, and a second AC voltage is applied to a bottom electrode in a plasma generation apparatus;
the semiconductor substrate is disposed on the bottom electrode; and
the plasma treatment is performed.

14. The method according to claim 13, wherein a first frequency of the first AC voltage is 10 MHz to 300 MHz.

15. The method according to claim 13, wherein a first power of the first AC voltage is 0.02 W·cm$^{-2}$ to 0.8 W·cm$^{-2}$.

16. The method according to claim 13, wherein the second AC voltage has a second power less than or equal to 1.6 W·cm$^{-2}$ and a second frequency lower than the first frequency.

17. The method according to claim 16, wherein the second frequency is 100 KHz to 500 KHz.

* * * * *